United States Patent
Santhanam et al.

(10) Patent No.: US 10,763,895 B2
(45) Date of Patent: Sep. 1, 2020

(54) CIRCUITRY AND METHOD FOR DUAL MODE REED-SOLOMON-FORWARD ERROR CORRECTION DECODER

(71) Applicant: Synopsys, Inc., Mountain View, CA (US)

(72) Inventors: Venugopal Santhanam, Bangalore (IN); Lokesh Kabra, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 199 days.

(21) Appl. No.: 15/997,297

(22) Filed: Jun. 4, 2018

(65) Prior Publication Data
US 2018/0358986 A1 Dec. 13, 2018

(30) Foreign Application Priority Data
Jun. 8, 2017 (IN) .............................. 201741020155

(51) Int. Cl.
*H03M 13/15* (2006.01)
*H03M 13/00* (2006.01)

(52) U.S. Cl.
CPC ..... *H03M 13/1515* (2013.01); *H03M 13/153* (2013.01); *H03M 13/157* (2013.01);
(Continued)

(58) Field of Classification Search
CPC ......... H03M 13/1515; H03M 13/6502; H03M 13/153; H03M 13/6516; H03M 13/1575; H03M 13/1545; H03M 13/157
See application file for complete search history.

(56) References Cited

U.S. PATENT DOCUMENTS 7,447,980 B2  11/2008 Xu et al.
7,870,469 B1 *  1/2011 Wu .................... H03M 13/1515
                                                714/784
(Continued)

FOREIGN PATENT DOCUMENTS

CN         107017962 A       8/2017

OTHER PUBLICATIONS

C. Yu and Y. Su, "Two-Mode Reed-Solomon Decoder Using a Simplified Step-by-Step Algorithm," in IEEE Transactions on Circuits and Systems II: Express Briefs, vol. 62, No. 11, pp. 1093-1097, Nov. 2015. (Year: 2015).*

(Continued)

*Primary Examiner* — Cynthia Britt
(74) *Attorney, Agent, or Firm* — Fenwick & West LLP

(57) ABSTRACT

A dual-mode Reed-Solomon decoder is configured to perform error correction for two different encoding schemes. The decoder includes a syndrome calculator block, a key equation solver block, a polynomial evaluation block, and an error correction block. The syndrome calculator block receives encoded input data and calculates syndromes, with the number of calculated syndromes based on the selected decoding mode. The key equation solver block calculates an error locator polynomial and an error evaluator polynomial for the encoded input data, with the degree of the polynomials based on the selected decoding mode. The polynomial evaluation block identifies error locations and magnitudes in the encoded data, with an array of constants input to the block based on the selected decoding mode. The error correction block decodes the encoded input data based on the identified error locations and error magnitudes.

20 Claims, 5 Drawing Sheets

(52) U.S. Cl.
CPC ... *H03M 13/1545* (2013.01); *H03M 13/1575* (2013.01); *H03M 13/6502* (2013.01); *H03M 13/6516* (2013.01)

(56) References Cited

U.S. PATENT DOCUMENTS

| | | | | |
|---|---|---|---|---|
| 2003/0046637 A1* | 3/2003 | Zhang | ............... | H03M 13/1515 714/784 |
| 2003/0101406 A1* | 5/2003 | Song | ................... | H03M 13/00 714/774 |
| 2005/0278610 A1* | 12/2005 | Banks | ............... | H03M 13/1515 714/784 |
| 2014/0380132 A1 | 12/2014 | Ran | | |
| 2017/0170927 A1 | 6/2017 | Stone et al. | | |

OTHER PUBLICATIONS

Chu Yu, Kuang-Hsiao Lee, Jin-Yu Chen, Mao-Wen Chen, Yi-An Chen, "Three-Parallel Reed-Solomon Decoder using a Simplified Step-by-Step Algorithm", Consumer Electronics (GCCE) 2018 IEEE 7th Global Conference on, pp. 105-106, 2018 (Year: 2018).*

Song, H. et al., "400GbE PCS Direct Coding Analysis," Huawei Technologies Co., Ltd., undated, pp. 1-12, May be Retrieved at<URL: http://www.ieee802.org/3/400GSG/public/13_11/song_400_01_1113.pdf.

"Construction Zones on the Ethernet Roadmap," The Next Platform, 2017, 14 pages, [Online] [Retrieved on Jun. 4, 2018] Retrieved from the Internet<URL:https://www.nextplatform.com/2016/03/24/construction-zones-ethernet-roadmap/>.

Sklar, B., "Reed-Solomon Codes," undated, 33 pages, [Online] [Retrieved on Jun. 4, 2018] Retrieved from the Internet<URL:http://ptgmedia.pearsoncmg.com/images/art_sklar7_reed-solomon/elementLinks/art_sklar7_reed-solomon.pdf>.

Sarwate, D.V. et al., "High-Speed Architectures for Reed-Solomon Decoders," IEEE Transactions on Very Large Integration (VLSI) Systems, Oct. 2001, pp. 641-655, vol. 9, No. 5.

Bates, S. et al., "Backplane NRZ FEC Baseline Proposal," IEEE P802.3bj, Mar. 2012, 22 pages, [Online] [Retrieved on Jun. 4, 2012] Retrieved from the Internet<URL:http://www.ieee802.org/3/bj/public/mar12/gustlin_01_0312.pdf>.

Kindap, N., "On an Architecture for a Parallel Finite Field Multiplier with Low Complexity Based on Composite Fields," Thesis, The Middle East Technical University, Aug. 2004, 79 pages.

Su, J. et al. "Parallel Structure of GF $(2^{14})$ and GF $(2^{18})$ Multipliers Based on Composite Finite Fields," IEEE, 2011, 4 pages.

Baden, E. et al., "Low Latency FEC Proposal," 25/50G Ethernet Consortium, Apr. 2017, 11 pages.

* cited by examiner

CIRCUITRY AND METHOD FOR DUAL MODE REED-SOLOMON-FORWARD ERROR CORRECTION DECODER

CROSS REFERENCE TO RELATED APPLICATIONS

This application claims the benefit of priority under 35 U.S.C. § 119 to Indian Provisional Application No. 201741020155, filed on Jun. 8, 2017, which is incorporated herein by reference in its entirety.

TECHNICAL FIELD

The present disclosure relates generally to a Reed-Solomon Forward Error Correction (FEC) decoder that can operate in multiple decoding modes.

BACKGROUND

High speed data communications are susceptible to noise, which results in corruption of the data during transmission. Forward error correction (FEC) schemes have been developed to enable receivers to detect and correct errors in the data they receive. Typically, stronger FEC schemes are used for faster data rates. A "stronger" FEC scheme is one that can detect and correct a greater number of bit errors in a block of data than a "weaker" FEC scheme.

The communications industry generally has progressed over time to using increasingly fast rates. For example, Ethernet connections with single lane rates of 25 Gigabit per second (25 Gbps) are currently being used within data centers. Recently, 50 Gigabit per second (50 Gbps) single lane rates have become more prevalent. In evolving networks, the data rate for all communications does not switch over from a slower data rate to a faster data rate instantaneously. Instead, evolving networks need to support data communications at multiple data rates simultaneously. To support multiple data rates, receiving equipment can be configured to support multiple different FEC schemes used for the transmissions at each of the data rates. For example, the FEC scheme for serial links carrying data at 50 Gbps per lane is stronger than the FEC scheme for serial links carrying data at 25 Gbps per lane. To accommodate multiple FEC schemes, existing equipment includes dedicated FEC decoders for each encoding scheme used in the network—e.g., a receiving device includes one decoder for 25 Gbps communications, and another decoder for 50 Gbps communications.

A typical FEC decoder used for 50 Gbps lane rates consumes approximately 1.9X the silicon area (i.e., chip size) compared to the silicon area consumed by a typical FEC decoder for 25 Gbps lane rates. Hence, with two dedicated, separate FEC solutions, the total silicon area is 1.9X+X=2.9X. In enterprise data center applications, in which each switch or router supports multiple ports each with its own set of decoders, reducing the silicon area per port can have large impact on chip size and static power consumption.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
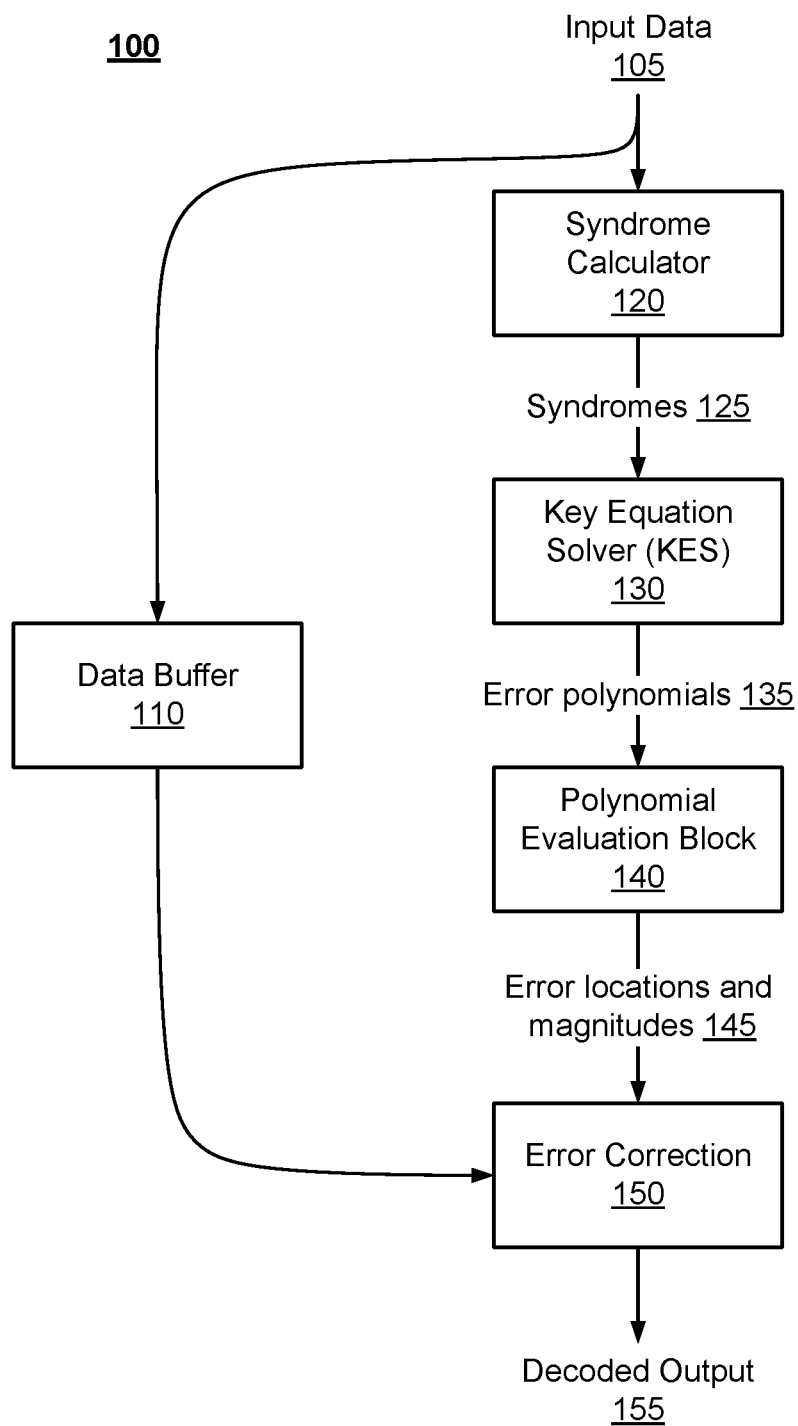
FIG. 1 is a block diagram showing an overview of a Reed-Solomon FEC Decoder, according to an embodiment.

During deployment of single lane 51.5625 Gbps (referred to as 50 Gbps) Serializer/Deserializer (SERDES) devices, e.g., for Ethernet repeaters and backplane applications, there will be need for co-existence with legacy speed modes having 25.78125 gigabits per second (Gbps) per lane (referred to as 25 Gbps), which typically uses Reed-Solomon (RS) (528,514) FEC encoding, also abbreviated herein as RS528. Per IEEE 802.3 specification, 50 Gbps line rates use stronger FEC in the form of RS (544,514), also abbreviated herein as RS544. There is presently a need to implement both RS (528,514) and RS (544,514) FEC decoders in a single system. As disclosed herein, a dual-mode Reed-Solomon decoder is configured to perform both RS (528, 514) and RS (544,514) decoding and can be switched between the RS (528,514) and RS (544,514) modes. As further speed modes and Reed-Solomon decoding schemes are deployed, dual-mode Reed-Solomon decoders for other combinations of FEC schemes can be designed and produced using the design principles described herein.

In one example embodiment, sub-blocks in the decoder include a syndrome calculator, an error location and error evaluator polynomial generator, a root finder, and error magnitude & correction logic. The error correction capabilities of RS (544,514) and RS (528,514) are different, with the former having 15 symbols error correction capability and the latter having 7 symbols error correction capability. Because of these differences in capabilities, the number of syndromes and degree of the error locator and evaluator polynomials are different. Therefore, the static configuration of one decoder cannot be used for the other. However, as discussed above, implementing dedicated decoders consumes significant silicon area.

A configuration (e.g., a decoder system, and a digital representation of the decoder stored on a non-transitory computer readable storage medium) for implementing Dual-mode Reed-Solomon FEC decoder supporting both RS (544,514) and RS (528,514) as per IEEE 802.3 specifications is disclosed. The dual mode support allows the same FEC decoder to be programmed in run time to operate either as an RS (528,514) decoder or an RS (544,514) decoder. In one embodiment, the dual mode RS FEC decoder can be used in Ethernet applications where the physical lane rates of 25 Gbps and 50 Gbps are supported. The disclosed dual mode RS FEC decoders offer significant area savings as opposed to having two dedicated RS FEC decoders each supporting one of the above-mentioned code types.

The disclosed configuration allows dynamic control of selection of syndrome results, setting the degree of the error locator and error evaluator polynomials and error magnitude calculators to support both type of decoders.

In an example register-transfer level (RTL) implementation, the area and timing advantage may be obtained when one of the operands in any operation is a constant. This thumb rule may be applied while adding the dynamic controls in the datapath such that the above-mentioned advantage is not sacrificed.

Referring now to Figure (FIG. 1, illustrated is a block diagram showing an overview of a Reed-Solomon FEC Decoder 100, according to an embodiment. The Reed-Solomon FEC decoder 100, also referred to as the decoder 100, receives input data 105. The input data 105 is data encoded according to one of several FEC encoding schemes, transmitted over a communications channel, and received at the decoder 100. The input data 105 is stored in a data buffer 110 while it is being analyzed to detect the location and magnitude of any errors in the input data 105 that occurred during the data transmission. In the embodiment shown in FIG. 1, while the input data 105 is stored in the data buffer 110, it is analyzed using a syndrome calculator block 120, a key equation solver (KES) block 130, and a polynomial evaluation block 140. Based on the results of the analysis, an error correction block 150 corrects the input data from data buffer 110.

The syndrome calculator 120 determines whether there are any errors in the input data 105. The syndrome calculator 120 determines a set of syndromes 125 that describe errors in the input data 105. A non-zero syndrome indicates that the input data 105 has errors in it, and provides information that can be used to identify the locations of the errors, and how the errors may be corrected. If all of the calculated syndromes for input data are zero, this indicates that there are no errors. The number of calculated syndromes 125 varies between different RS FEC encoding schemes; for example, a RS (528,514) decoder calculates 14 syndromes, and RS (544,514) calculates an additional 16 syndromes for a total of 30 syndromes.

The syndromes 125 are input to the KES block 130. The KES block 130 calculates error polynomials 135, i.e., error locator and error evaluator polynomials, which can be used to determine the locations and magnitudes of errors in the input data 105. The degrees of the error locator polynomial and the error evaluation polynomial vary between different RS FEC encoding schemes. For example, the error locator polynomial has a degree of 7 for a RS (528,514) decoder and a degree of 15 for a RS (544,514) decoder, and the error evaluator polynomial has a degree of 6 for a RS (528,514) decoder and a degree of 14 for a RS (544,514) decoder. The KES block 130 may be configured to implement the Inversion-less Berlekamp Massey (BMI) algorithm.

The error polynomials 135 are input to the polynomial evaluation block 140. The polynomial evaluation block 140 finds the roots to the error polynomials 135 (e.g., using a Chien search method), determines the error locations, and calculates the error magnitudes (e.g., using the Forney algorithm). In other embodiments, different methods can be used to find the polynomial roots and/or calculate the error locations and magnitudes. The polynomial evaluation block 140 outputs the error locations and magnitudes 145 describing errors in the input data 105.

The error correction block 150 receives the error locations and magnitudes 145 from the polynomial evaluation block 140, and receives the input data 105 from the data buffer 110. The error correction block 150 corrects the errors in the input data 105 as identified by the syndrome calculator block 120, the KES block 130, and the polynomial evaluation block 140 to generate decoded output 155. Given the error magnitudes 145 from the polynomial evaluation block 140, error correction involves XORing the data read from the data buffer 110 with the error magnitudes. In the architecture described herein, the same error correction block 150 is used for both RS528 and RS544 decoder modes.

Figure 3:
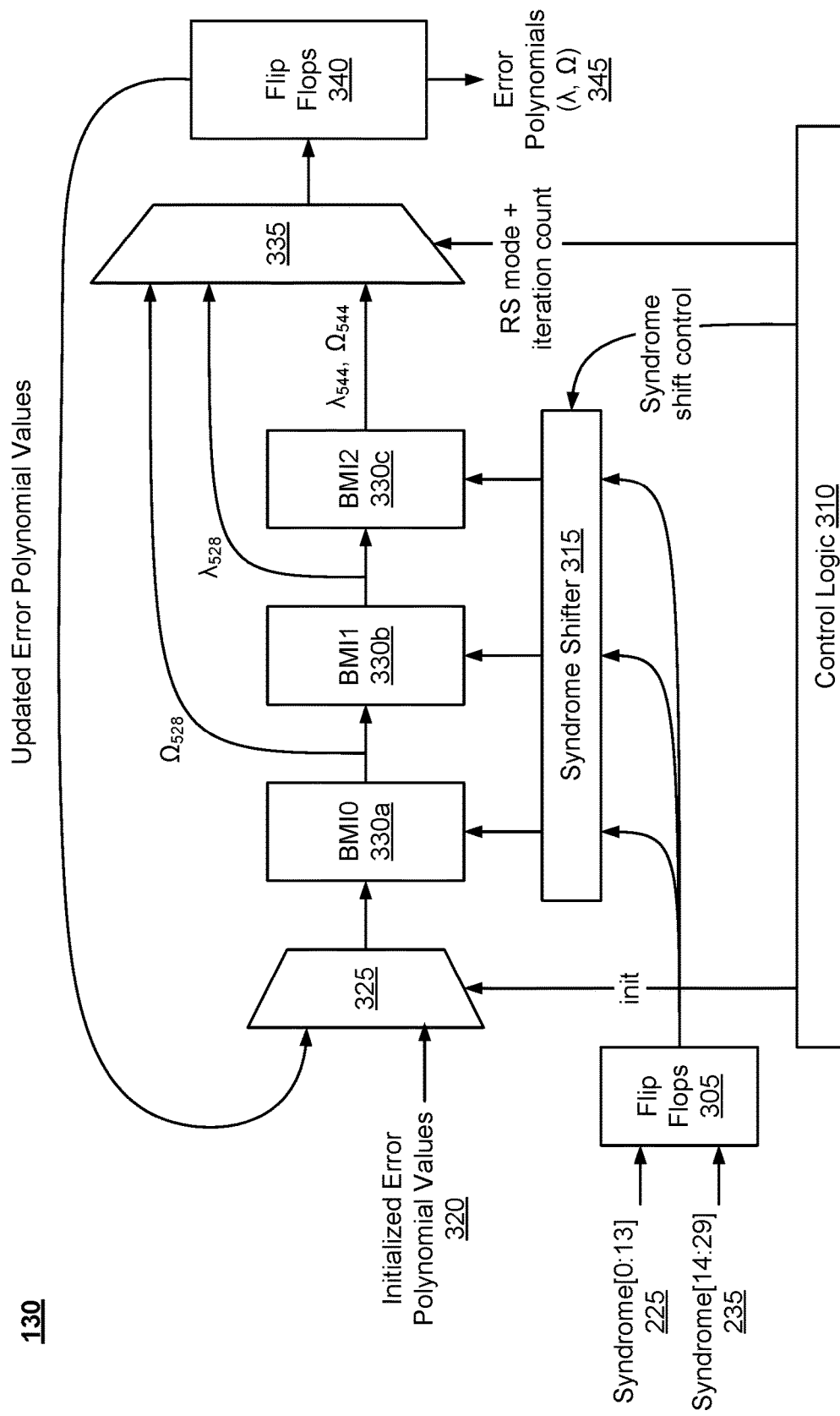
FIG. 3 is a block diagram showing the Key Equation Solver (KES) block of the decoder as configured for two FEC schemes, according to an embodiment.
Figure 4:
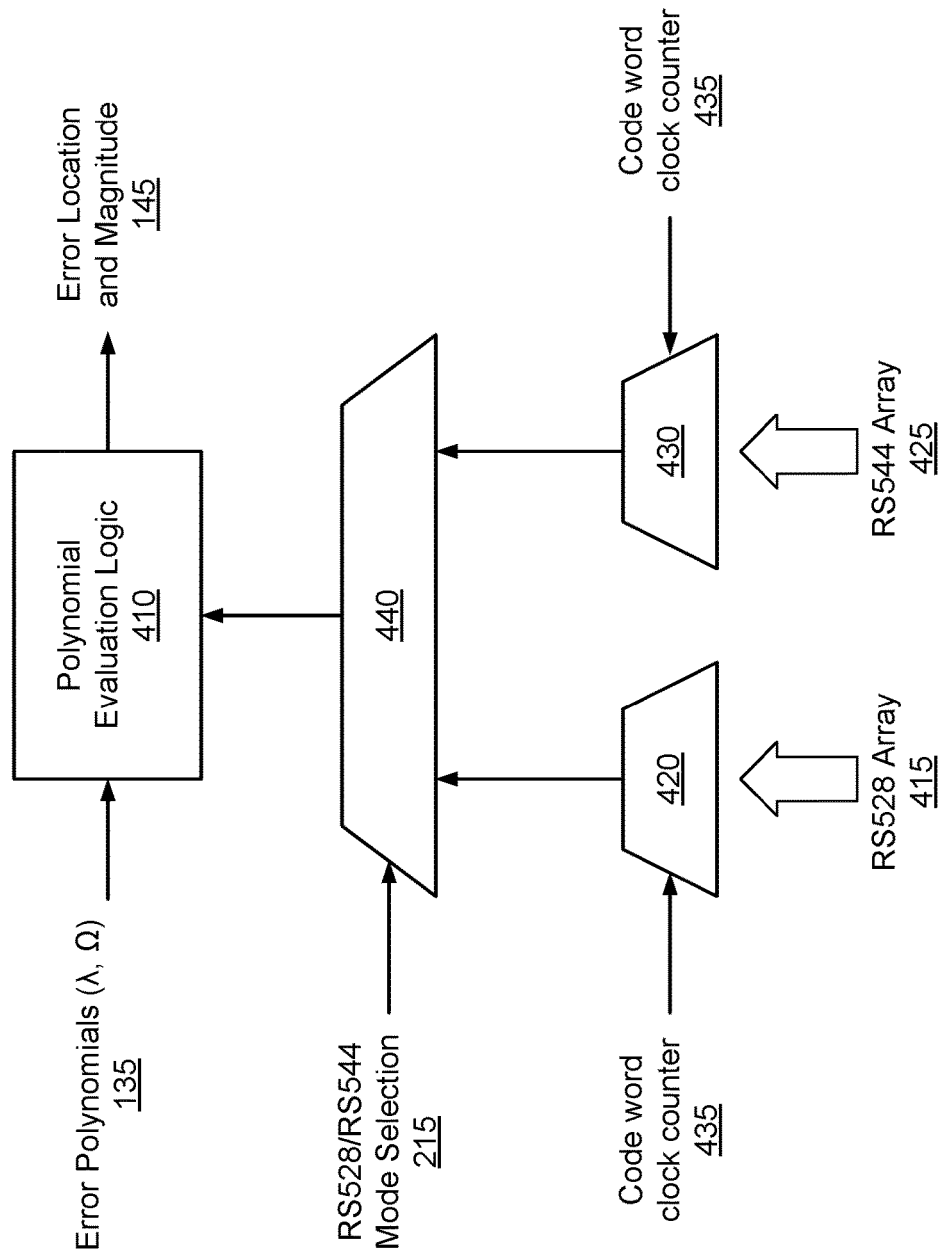
FIG. 4 is a block diagram showing the polynomial evaluation block of the decoder as configured for two FEC schemes, according to an embodiment.

In the disclosed architecture for supporting dual FEC modes, the syndrome calculator block 120, KES block 130, and polynomial evaluation block 140 may each be modified from their single-mode configurations so that they can switch between two or more different modes. The modifications to blocks 120, 130, and 140 for an exemplary dual-mode RS (544,514) and RS (528,514) decoder are shown in FIGS. 2, 3, and 4, respectively.

The data buffer 110 and the blocks 120, 130, 140, and 150 each represent a collection of logic components (e.g., logic gates, memory elements, connectors) configured to perform the functions described herein. Each block 120, 130, 140 includes multiple sub-blocks, also made up of logic components, and each configured to performing one or more sub-functions, such as the sub-functions described with respect to FIGS. 2-4. Each of the logic blocks may be configured to perform complex mathematical functions, and may be based on simple logic gates, such as AND and XOR logic blocks. The decoder 100 also includes memory elements, which may be simple latches or flip-flops, or more complex blocks of memory.

The decoder 100 may be implemented as a reconfigurable logic device, such as a field-programmable gate array (FPGA), that includes an array of programmable logic blocks and a hierarchy of reconfigurable interconnects that allow the programmable logic blocks to be coupled to each other according to the descriptions in hardware description language (HDL) code. Alternatively, the decoder 100 may be implemented by non-reconfigurable logic device, such as an application-specific integrated circuit (ASIC) or other integrated circuit format. Furthermore, the decoder 100 or portions of the decoder 100 can be equivalently implemented on standard integrated circuits, as one or more computer programs running on one or more processing devices (e.g., as one or more programs running on one or more computer systems), as one or more programs running on one or more processors (e.g., as one or more programs running on one or more microprocessors), as firmware, as a digital signal processor (DSP), or as any combination thereof. The design of the decoder 100, or portions on the decoder 100, may be stored as a digital representation on a computer-readable medium.

Figure 2:
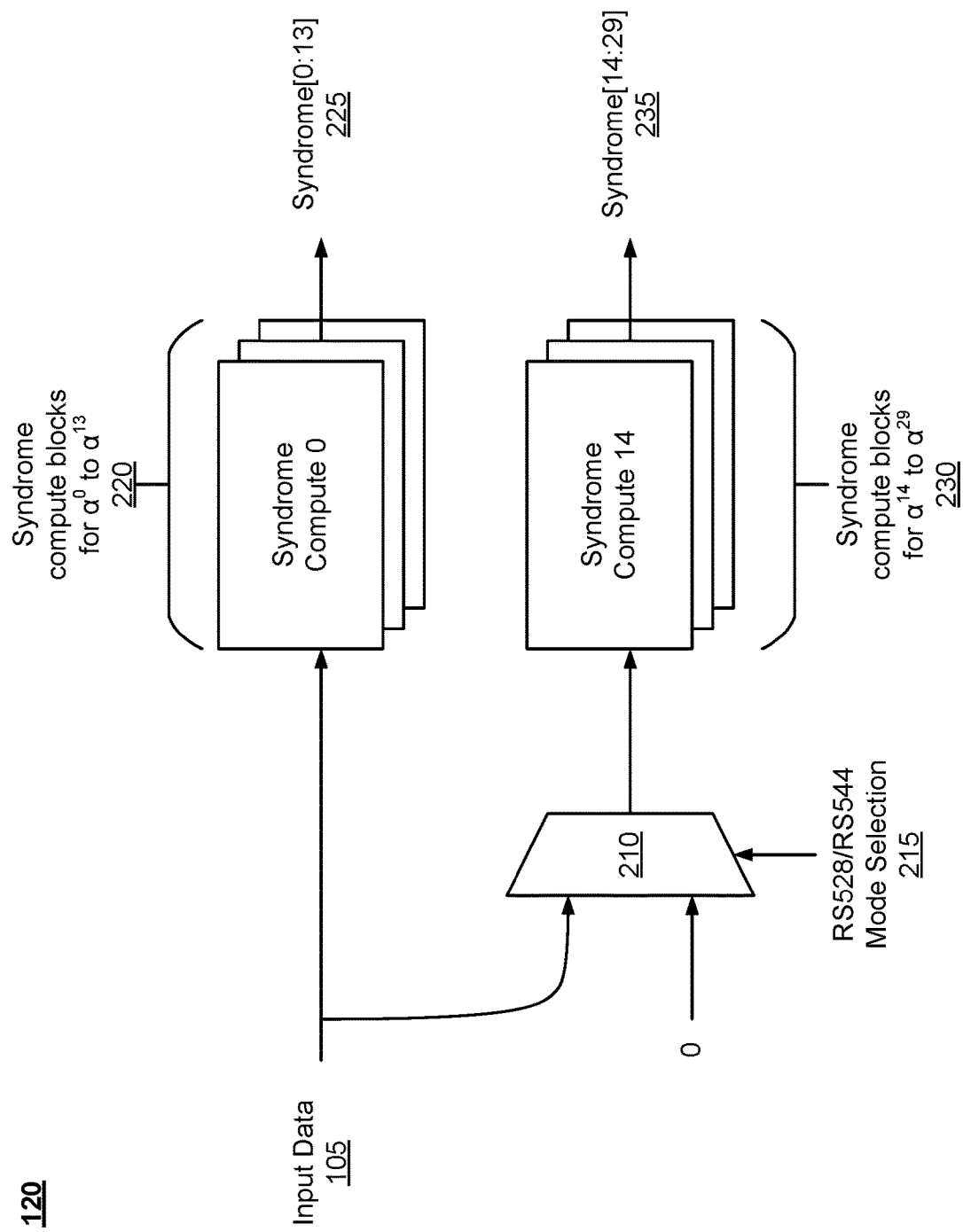
FIG. 2 is a block diagram showing the syndrome calculator block of the decoder as configured for two FEC schemes, according to an embodiment.

FIG. 2 is a block diagram showing the syndrome calculator block 120 of the decoder 100 as configured for the RS (544,514) and RS (528,514) schemes. For the RS (544,514) mode, 30 syndromes are calculated, and for the RS (528, 514) mode, 14 syndromes are calculated. While separate RS (544,514) and RS (528,514) decoders would include 44 syndrome compute blocks (30 in the RS544 decoder, plus 14 for RS528 decoder), in the dual-mode syndrome calculator block 120, the 14 syndrome compute blocks common to both RS528 and RS544 are used for both RS528 and RS544 decoding. This results in area savings of 14 syndrome compute blocks compared to using two separate decoders.

As shown in FIG. 2, the syndrome calculator block 120 receives the input data 105. In both the RS (544,514) and RS (528,514) modes, the input data 105 is input to a first group of syndrome compute blocks 220, which includes 14 syndrome compute blocks (e.g., Syndrome Compute 0 through Syndrome Compute 13) corresponding to $\alpha^0$ through $\alpha^{13}$ where each $\alpha$ is a primitive element of the finite field defined by the polynomial $x^{10}+x^3+1$. The syndrome compute blocks 220 output syndrome[0:13] 225, which are 14 syndromes common to both the RS (544,514) and RS (528,514) modes. Each output syndrome[0:13] 225 may be 10 bits.

The syndrome calculator block 120 includes a second group of syndrome compute blocks 230, which includes 16 syndrome compute blocks (e.g., Syndrome Compute 14 through Syndrome Compute 29) corresponding to $\alpha^{14}$ through $\alpha^{29}$, where each $\alpha$ is a primitive element of the finite field defined by the polynomial $x^{10}+x^3+1$. The second group of syndrome compute blocks 230 output syndrome[14:29] 235, which are 16 syndromes used only by the RS (544,514) mode. Each output syndrome[14:29] 235 may also be 10 bits.

These additional 16 syndromes 235 (corresponding to syndrome 14-29) for the RS (544,514) mode are calculated in a different group of syndrome compute blocks 230 from syndromes 225, and the second group of syndrome compute blocks 230 are enabled in the RS (544,514) mode and disabled for the RS(528,514) mode. To selectively enable the syndrome compute blocks 230, the data selector 210 selects either the input data 105 in the RS (544,514) mode or a zero input in the RS (528,514) mode. The data selector 210 is controlled by an RS528/RS544 mode selection signal 215, which indicates the decoding mode that corresponds to the input data 105.

FIG. 3 is a block diagram showing the Key Equation Solver (KES) block 130 of the decoder as configured for the RS (544,514) and RS (528,514) schemes. As discussed above, the degree of the error locator polynomial, referred to as $\lambda$, and the degree of the error evaluator polynomial, referred to as $\Omega$, both differ between the RS (544,514) and RS (528,514) modes. The configuration shown in FIG. 3 uses a common KES block for computing the two polynomials for both modes, providing significant area savings.

The KES block 130 receives the syndrome[0:13] 225 and syndrome[14:29] 235 (which are the syndromes calculated by the syndrome compute blocks 230 for RS (544,514), or zeros for RS (528,514)) from by the syndrome calculator block 120 and stores the syndromes 225 and 235 in a set of flip flops 305. Control logic 310 for the KES block 130 receives the RS528/RS544 mode selection signal 215, and the control logic 310 controls the KES block 130 according to the selected mode. In particular, the control logic 310 provides a signal to initialize values for calculating the error locator polynomial and the error evaluator polynomial, syndrome shift controls for controlling the inputs to polynomial calculation blocks, and a signal to control the output of the calculation based on the selected mode. The control logic 310 keeps track of the current iteration, and determines the syndrome shift controls and the signal to control the output based on the current iteration and the selected RS mode.

The Key Equation Solver represented in FIG. 3 is based on the Inversion-less Berlekamp Massey (BMI) algorithm. With '2t' parity symbols, the BMI algorithm involves 2*t iterations of computation to calculate the error locator polynomial and t iterations to calculate the error evaluator polynomial. The disclosed configuration performs up to three iterations of computation during a single clock cycle by using three BMI blocks. The total number of clock cycles needed to compute the polynomials are tabulated in Table 1.

TABLE 1

| Polynomial | Number of iterations | Clock Cycles for RS (544, 514) | Clock Cycles for RS (528, 514) |
|---|---|---|---|
| Error Locator ($\lambda$) | 30 | 30/3 = 10 | 14/3 = ceil[14/3] + 1 = 5 |
| Error Evaluator ($\Omega$) | 15 | 15/3 = 5 | 7/3 = ceil[7/3] + 1 = 3 |

In the architecture shown in FIG. 3, the three BMI blocks are represented as BMI0 330a, BMI1 330b, and BMI2 330c, in which each block 330 performs one iteration. The BMI blocks 330 receive input polynomial values from a multiplexer 325 and syndromes from the flip flops 305 via the syndrome shifter 315, and perform BMI calculations based on these inputs. The syndrome shifter 315 shifts the syndromes read from the flip flops 305 based on a syndrome shift control signal provided by the control logic 310 to the syndrome shifter 315. The syndrome shift control signal provided by the control logic 310 for shifting the syndromes to the BMI blocks 330 depends on the RS mode and the current iteration.

At the beginning of the BMI algorithm, the multiplexer 325 provides initialized error polynomial values 320 to the BMI blocks 330 in response to the initialization signal from the control logic 310. The initialized error polynomial values can include the error locator polynomial, the error evaluator polynomial, and other values used during the calculation of the error locator and error evaluator polynomials (not shown in FIG. 3). For subsequent clock cycles, the multiplexer 325 outputs updated error polynomial values based on the output of the multiplexer 335, which are stored in flip flops 340.

The multiplexer 335 receives calculation results from the BMI blocks 330 during the course of the BMI algorithm. In the disclosed configuration, the error locator and error evaluator polynomials may be available from different BMI blocks. Based on the iteration count and the RS FEC mode, the results are retrieved, or "tapped," from appropriate BMI block 330a, 330b, or 330c, and are multiplexed by multiplexer 335 to the flip flops 340, which stores the results. As shown in FIG. 3, in RS (544,514), both error locator and error evaluator results (labelled $\lambda_{544}$ and $\Omega_{544}$, respectively) are available at the output of BMI2 330c. In RS (528,514), the error locator (labelled $\lambda_{528}$) is tapped from BMI1 330b, and the error evaluator (labelled $\Omega_{528}$) is tapped from BMI0 330a. The multiplexer 335 taps the BMIs 330 according to the RS mode and iteration count provided by the control logic 310.

In the architecture shown in FIG. 3, the components of the KES block 130 are shared between both RS modes. The KES block 130 is only slightly larger than a KES block of a single-mode RS (544,514) decoder, to accommodate the control logic 310 for implementing the RS (528,514) mode. Thus, nearly the entire area of the KES block for a single-mode RS (528,514) decoder is saved by using the shared dual-mode KES block 130.

FIG. 4 is a block diagram showing the polynomial evaluation block 140 of the decoder as configured for the RS (544,514) and RS (528,514) schemes. In some embodiments, the polynomial evaluation block 140 implements the Chien search algorithm and the Forney algorithm to evaluate the polynomials and determine the error locations and magnitudes 145. In other embodiments, the decoder 100 may include one block for Chien search, and a separate block for the Forney algorithm. The Chien search algorithm finds the roots of the error locator polynomial $\lambda$, which can be used to determine the locations of the errors. The Forney algorithm calculates the error magnitudes based on the error evaluator polynomial $\Omega$. In the architecture shown in FIG. 4, the logic performing the Chien search and Forney algorithm, jointly referred to as polynomial evaluation logic 410, are shared by both RS modes, without changes from standard Chien search and Forney algorithm logic for RS (544, 514). To enable the polynomial evaluation block 140 to determine the error location and magnitudes 145 for both RS modes based on the received error polynomials 135, the block 140 includes logic for selecting the constant values used in the polynomial evaluation based on the RS mode.

In particular, the polynomial evaluation logic 410 is configured to operate on one of two different arrays of constants used to evaluate the polynomials in the different modes. The RS528 array 415 is a 528-long array of constants used to evaluate the error polynomials 135 in the RS (528,514) mode. The RS544 array 425 is a 544-long array of constants used to evaluate the error polynomials 135 in the RS (544,514) mode. Each array 415 and 425 is input to a respective multiplexer 420 or 430. The polynomial evaluation logic 410 does not evaluate a full array 415 or 425 at once, but instead receives portions of an array 415 or 425, and evaluates each portion sequentially. The code word clock counter 435 tracks the iteration of the polynomial evaluation logic 410 and provides a signal to the multiplexers 420 and 430 that the multiplexers 420 and 430 use to select a portion of their respective array 415 or 425.

The selected portions of the arrays 415 and 425 are provided from the multiplexers 420 and 430, respectively, to another multiplexer 440. The multiplexer 440 receives the RS528/RS544 mode selection signal 215, and based on this signal 215, selects either the array portion from multiplexer 420 (if RS (528,514) mode is selected) or the array portion from multiplexer 430 (if RS (544,514) mode is selected). The selected array portion based on the RS mode is provided from the multiplexer 440 to the polynomial evaluation logic 410. The polynomial evaluation logic 410 evaluates portions of the selected array 415 or 425 sequentially and provides the error locations and magnitudes 145.

In the architecture shown in FIG. 4, the polynomial evaluation logic 410 is shared between both RS modes. The polynomial evaluation block 140 is only slightly larger than a Chien-Foreny block of a single-mode RS (544,514) decoder, to accommodate the RS528 array 415, multiplexer 420, and multiplexer 440 for implementing the RS (528,514) mode and switching between the RS (528,514) and RS (544,514) modes. Thus, nearly the entire area of the Chien-Foreny block for a single-mode RS (528,514) decoder is saved by using a shared dual-mode Chien-Foreny block.

Figure 5:
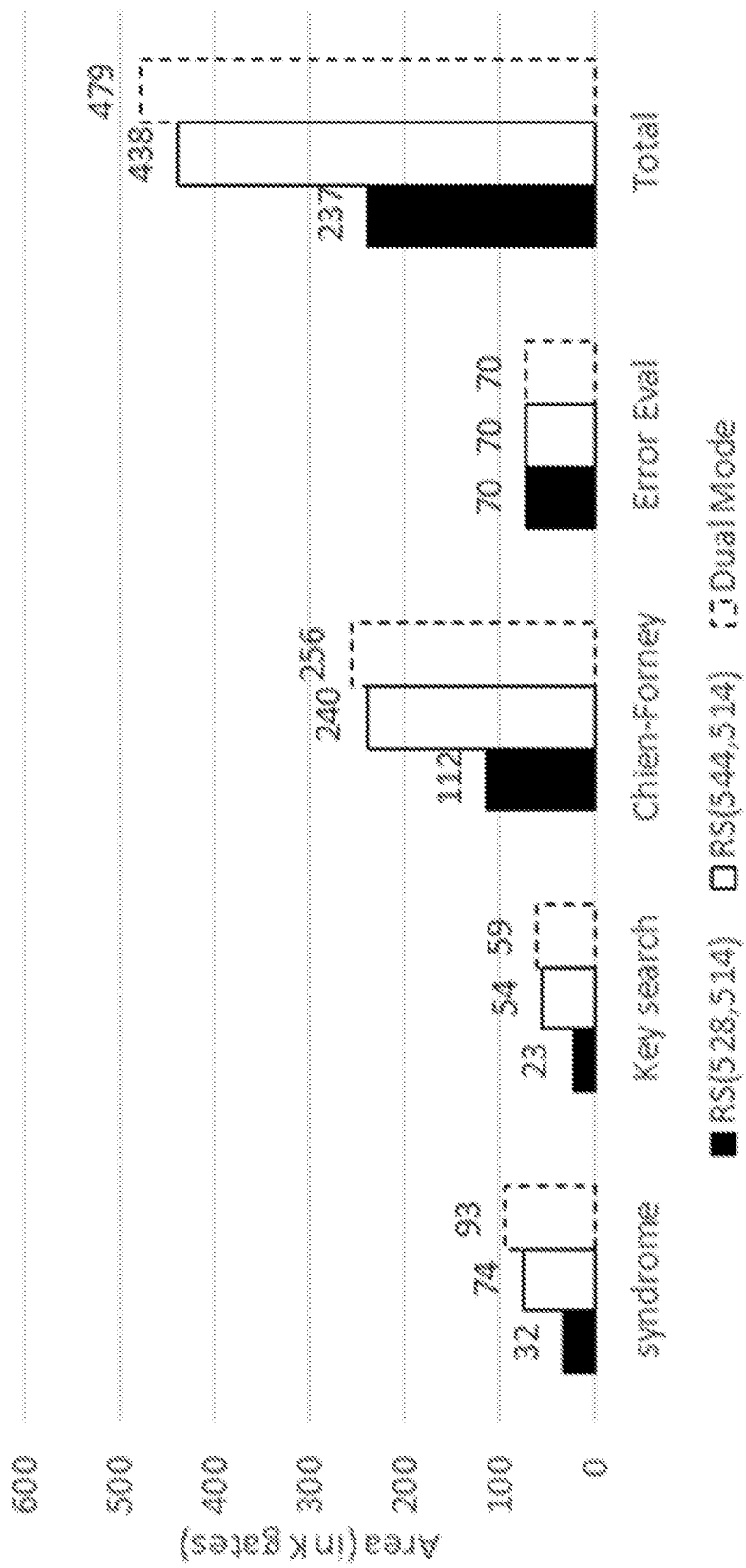
FIG. 5 is a bar graph comparing the silicon area of two single-mode RS decoders to the exemplary dual-mode decoder disclosed herein.

FIG. 5 is a bar graph showing the silicon area, measured in number of gates, for each of blocks and for the full RS decoder for a single-mode RS (528,514) decoder, a single-mode RS (544,514) decoder, and the exemplary dual-mode decoder disclosed herein. Using each of the syndrome calculator block 120, KES block 130, and Chien-Foreny implementation of the polynomial evaluation block 140 described herein results in an approximately 30% reduction in silicon area compared to using two separate RS (528,514) and RS (544,514) decoders. The reduced silicon area results in a proportional savings in static power consumption.

In other embodiments, alternate configurations for one or more of the syndrome calculator block 120, KES block 130, and polynomial evaluation block 140 are used. In some embodiments, rather than using a dual-mode blocks 120, 130, or 140 disclosed herein, two single-mode blocks may be used. For example, an embodiment may include two single-mode syndrome calculator blocks, a dual-mode KES block, and a dual-mode polynomial evaluation block.

While a dual-mode RS (528,514) and RS (544,514) decoder is described herein, it should be understood that a similar design can be applied to dual-mode decoders with different RS schemes. Furthermore, the designs shown in FIGS. 1-4 can be expanded to include additional modes, e.g., for a tri-mode decoder. For example, the syndrome calculator block 120 can include different numbers of syndrome compute blocks 220 and 230 for different RS modes, and the syndrome calculator blocks 120 can include one or more additional groups of syndrome compute blocks to calculate syndromes for additional RS modes. The KES block 130 can use modified control logic 310 configured to shift the syndromes and select the outputs from the BMI blocks for alternate or additional RS modes. The multiplexer 440 of the polynomial evaluation block 140 can be configured to receive array portions for one or more additional or alternate constant arrays for one or more additional or alternate RS modes. The additional mode may be another modes in the same Galois Field GF($2^n$) as the other modes.

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A dual-mode Reed-Solomon decoder for a high speed communication system, the decoder comprising:
   a syndrome calculator circuit configured to:
      receive encoded input data; and
      calculate, based on the encoded input data, a plurality of syndromes, the number of syndromes in the plurality of syndromes based on a selected decoding mode selected from at least a first decoding mode and a second decoding mode;
   a key equation solver circuit configured to calculate, based on the plurality of syndromes, an error locator polynomial and an error evaluator polynomial for the encoded input data, a degree of the error locator polynomial and a degree of the error evaluator polynomial calculated by the key equation solver circuit based on the selected decoding mode;
   a polynomial evaluation circuit configured to:
      select an array of constants based on the selected decoding mode; and
      identify error locations and error magnitudes in the encoded input data based on the selected array of constants, the error locator polynomial, and error evaluator polynomial; and
   an error correction circuit configured to:
      decode the encoded input data based on the identified error locations and error magnitudes; and
      output the decoded input data to the high speed communication system.

2. The dual-mode Reed-Solomon decoder of claim 1, wherein the syndrome calculator circuit comprises a first group of syndrome compute circuits configured to calculate syndromes in the first decoding mode and the second decoding mode, and a second group of syndrome compute circuits configured to calculate syndromes in the second decoding mode and not in the first decoding mode.

3. The dual-mode Reed-Solomon decoder of claim 2, wherein the syndrome calculator circuit further comprises a multiplexer for selecting, in the second decoding mode, the encoded input data and providing the encoded input data to the second group of syndrome compute circuits.

4. The dual-mode Reed-Solomon decoder of claim 1, wherein the key equation solver circuit comprises:

a plurality of Inversion-less Berlekamp Massey (BMI) logic circuits for performing Inversion-less Berlekamp Massey calculations; and a control logic circuit configured to control shifting of the plurality of syndromes provided to the plurality of BMI logic circuits based on the selected decoding mode, and configured to control retrieval of computational results from the plurality of BMI logic circuits based on the selected decoding mode.

5. The dual-mode Reed-Solomon decoder of claim 1, wherein the key equation solver circuit is configured to perform a number of iterations of an Inversion-less Berlekamp Massey (BMI) algorithm based on the selected decoding mode.

6. The dual-mode Reed-Solomon decoder of claim 1, wherein the polynomial evaluation circuit comprises logic configured to perform a Chien search to identify the error locations and perform a Forney algorithm to determine the error magnitudes from error locator polynomials and error evaluator polynomials of different degrees.

7. The dual-mode Reed-Solomon decoder of claim 1, wherein the decoding mode is selected from the first decoding mode, the second decoding mode, and a third decoding mode.

8. The dual-mode Reed-Solomon decoder of claim 1, wherein the first decoding mode is RS (528,514), and the second decoding mode is RS (544,514).

9. The dual-mode Reed-Solomon decoder of claim 1, further comprising a data buffer configured to:
store the encoded input data during operation of the syndrome calculator circuit, the key equation solver circuit, and the polynomial evaluation circuit; and
provide the stored encoded input data to the error correction circuit.

10. The dual-mode Reed-Solomon decoder of claim 1, wherein the dual-mode Reed-Solomon decoder comprises fewer logic gates than a combined number of logic gates in a single-mode Reed-Solomon decoder for the first decoding mode and a number of logic gates in a single-mode Reed-Solomon decoder for the second decoding mode.

11. A non-transitory computer-readable storage medium storing digital representation of a dual-mode Reed-Solomon decoder for a high speed communication system, the dual-mode Reed-Solomon decoder comprising:
a syndrome calculator circuit configured to:
receive encoded input data; and
calculate, based on the encoded input data, a plurality of syndromes, the number of syndromes in the plurality of syndromes based on a selected decoding mode selected from at least a first decoding mode and a second decoding mode;
a key equation solver circuit configured to calculate, based on the plurality of syndromes, an error locator polynomial and an error evaluator polynomial for the encoded input data, a degree of the error locator polynomial and a degree of the error evaluator polynomial calculated by the key equation solver circuit based on the selected decoding mode;
a polynomial evaluation circuit configured to:
select an array of constants based on the selected decoding mode; and
identify error locations and error magnitudes in the encoded input data based on the selected array of constants, the error locator polynomial, and error evaluator polynomial; and an error correction circuit configured to:
decode the encoded input data based on the identified error locations and error magnitudes; and
output the decoded input data to the high speed communication system.

12. The non-transitory computer-readable storage medium of claim 11, wherein the syndrome calculator circuit comprises a first group of syndrome compute circuits configured to calculate syndromes in the first decoding mode and the second decoding mode, and a second group of syndrome compute circuits configured to calculate syndromes in the second decoding mode and not in the first decoding mode.

13. The non-transitory computer-readable storage medium of claim 12, wherein the syndrome calculator circuit further comprises a multiplexer for selecting, in the second decoding mode, the encoded input data and providing the encoded input data the second group of syndrome compute circuits.

14. The non-transitory computer-readable storage medium of claim 11, wherein the key equation solver circuit comprises:
a plurality of Inversion-less Berlekamp Massey (BMI) logic circuits for performing Inversion-less Berlekamp Massey calculations; and
a control logic circuit configured to control shifting of the plurality of syndromes provided to the plurality of BMI logic circuits based on the selected decoding mode, and configured to control retrieval of computational results from the plurality of BMI logic circuits based on the selected decoding mode.

15. The non-transitory computer-readable storage medium of claim 11, wherein the key equation solver circuit is configured to perform a number of iterations of an Inversion-less Berlekamp Massey (BMI) algorithm based on the selected decoding mode.

16. The non-transitory computer-readable storage medium of claim 11, wherein the polynomial evaluation circuit comprises logic configured to perform a Chien search to identify the error locations and perform a Forney algorithm to determine the error magnitudes from error locator polynomials and error evaluator polynomials of different degrees.

17. The non-transitory computer-readable storage medium of claim 11, wherein the decoding mode is selected from the first decoding mode, the second decoding mode, and a third decoding mode.

18. The non-transitory computer-readable storage medium of claim 11, wherein the first decoding mode is RS (528,514), and the second decoding mode is RS (544,514).

19. The non-transitory computer-readable storage medium of claim 11, further comprising a data buffer configured to:
store the encoded input data during operation of the syndrome calculator circuit,
the key equation solver circuit, and the polynomial evaluation circuit; and
provide the stored encoded input data to the error correction circuit.

20. The non-transitory computer-readable storage medium of claim 11, wherein the dual-mode Reed-Solomon decoder comprises fewer logic gates than a combined number of logic gates in a single-mode Reed-Solomon decoder for the first decoding mode and a number of logic gates in a single-mode Reed-Solomon decoder for the second decoding mode.

* * * * *